United States Patent [19]
Jacks et al.

[11] Patent Number: 5,031,820
[45] Date of Patent: Jul. 16, 1991

[54] PCB REWORK STATION

[75] Inventors: David C. Jacks, Pomona; Randall R. Walston, Torrance; Silvestre Lopez, Los Angeles, all of Calif.

[73] Assignee: Eldon Industries, Inc., Inglewood, Calif.

[21] Appl. No.: 475,138

[22] Filed: Feb. 1, 1990

[51] Int. Cl.$^5$ .................................................. B23K 37/04
[52] U.S. Cl. ..................................... 228/6.2; 228/49.1
[58] Field of Search ................ 228/119, 191, 6.2, 45, 228/180.2, 49.1; 269/61, 203

[56] References Cited

U.S. PATENT DOCUMENTS

| | | | |
|---|---|---|---|
| 2,081,639 | 5/1937 | Perry | 269/61 |
| 2,783,531 | 3/1957 | Eisler | 269/61 |
| 3,611,561 | 4/1969 | Dosier | |
| 3,628,717 | 12/1971 | Lynch | 228/6.2 |
| 3,793,710 | 2/1974 | Monahan et al. | |
| 3,843,036 | 10/1974 | Monahan | 228/6.2 |
| 4,116,376 | 9/1978 | Delorme | 228/180.2 |
| 4,610,388 | 9/1986 | Koltuniak | 228/20 |
| 4,659,004 | 4/1987 | Fridman | 228/6.2 |
| 4,659,072 | 4/1987 | De La Rosa | 269/61 |
| 4,696,096 | 9/1987 | Green et al. | |
| 4,844,324 | 7/1989 | Todd | 228/180.2 |

*Primary Examiner*—Samuel M. Heinrich
*Attorney, Agent, or Firm*—Price, Gess & Ubell

[57] ABSTRACT

A rework station for soldering/desoldering of integrated circuits on a printed circuit board (PCB) wherein a gantry mounted on a base positions hot gas delivery and vacuum application apparatus over a PCB carried between carrier arms mounted on a horizontal arm slidably mounted in a pinion block for movement in the X direction with respect to the base. The pinion block is slidably mounted in the base for movement in the Y direction. A combination of sprockets and idlers transmits X and Y drives for driving the horizontal arm and pinion block from control dials mounted at the front edge of the base.

16 Claims, 9 Drawing Sheets

PCB REWORK STATION

BACKGROUND OF THE INVENTION

1. Field of the Invention

The subject invention relates generally to printed circuit boards (PCBs) and, more particularly, to a versatile rework/prototype and repair machine for surface mounted and conventional leaded components attached to PCBs.

2. Description of Related Art

Printed circuit board rework apparatus employing hot air soldering/desoldering is generally known in the art, for example, as shown in Koltuniak et al. U.S. Pat. No. 4,610,388 assigned to Eldon Industries, Inc., Inglewood, Calif. Such apparatus has exhibited considerable commercial success attributable to its unique combination of features and flexible operation.

Koltuniack et al. disclose a preferred embodiment employing knobs providing for horizontal Y direction and vertical Z direction adjustment of the gas delivery head. Horizontal X positioning of the PCB with respect to the gas delivery head is accomplished in the preferred embodiment by mounting the PCB on a slidable rod which may be fixed in position by turning a knurled knob.

While apparatus configured according to Koltuniack et al. has attained considerable commercial success attributable to its unique features and flexible operation, it has occurred to the inventors that such apparatus could be improved both in convenience and ease of operation, while at the same time reducing its cost.

SUMMARY OF THE INVENTION

It is, therefore, an object of the invention to improve printed circuit board rework apparatus;

It is another object of the invention to provide improved apparatus for manipulating a printed circuit board or other object;

It is another object of the invention to provide improved apparatus for manipulating a printed circuit board with respect to a hot air solder/desolder gas discharge; and It is another object of the invention to provide solder rework apparatus which exhibits reduced cost and increased ease of operation.

According to the invention, improved manipulation characteristics and ease of operation are provided by a means which positions a holder means above a base and slidably mounts the holder means for movement in the X direction of an XYZ coordinate system. First and second moving means are then provided for respectively moving the holder means in the X direction and the positioning means in the Y direction. These moving means are responsive to manual control means to achieve desired positioning of the holder means in the XY plane.

Advantageously and according to a further feature of the invention, the foregoing apparatus is combined with a hot air rework apparatus. The hot air rework apparatus employs a gantry mounting a hot gas/vacuum head, which is adjustable in the "Z" direction. A PCB is placed in the holder means, where its position in the XY plane is controllable.

According to another feature of the invention, XY control of the holder means is accomplished through manipulation of two dials mounted at the front edge of the device. The dials operate through a drive system located in the base of the unit to expeditiously and economically provide XY positioning of the PCB with respect to the gas delivery head.

BRIEF DESCRIPTION OF THE DRAWINGS

The just-summarized invention will now be described in detail in conjunction with the drawings, of which.

DESCRIPTION OF THE PREFERRED EMBODIMENTS

Figure 1:
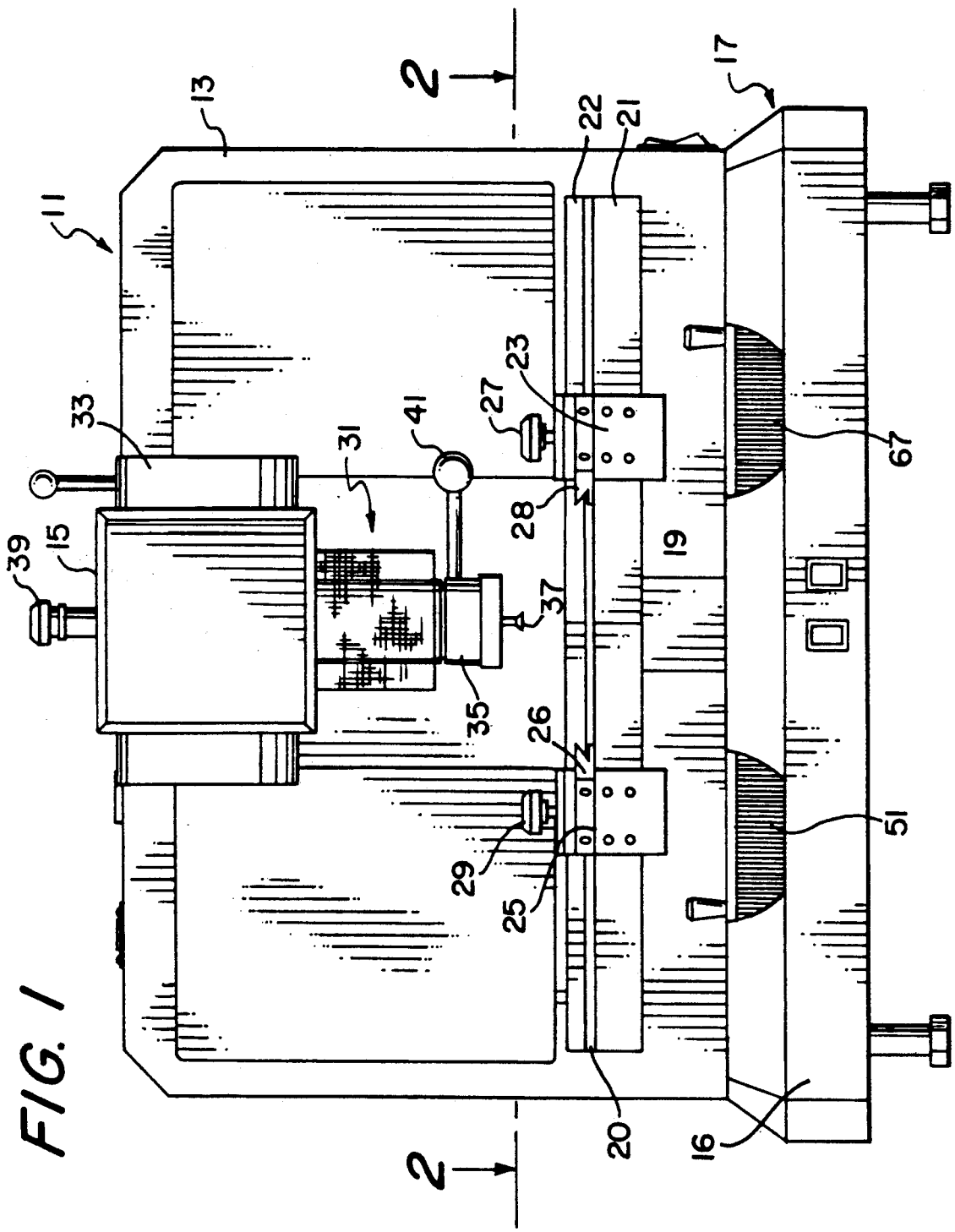
FIG. 1 is a front view of the preferred embodiment of the invention.

A work station 11 according to the preferred embodiment is shown in FIG. 1. It includes an upright housing portion 13 mounted on a substantially rectangular base 17. A gantry 15 extends from the upright housing 13.

Figure 5:
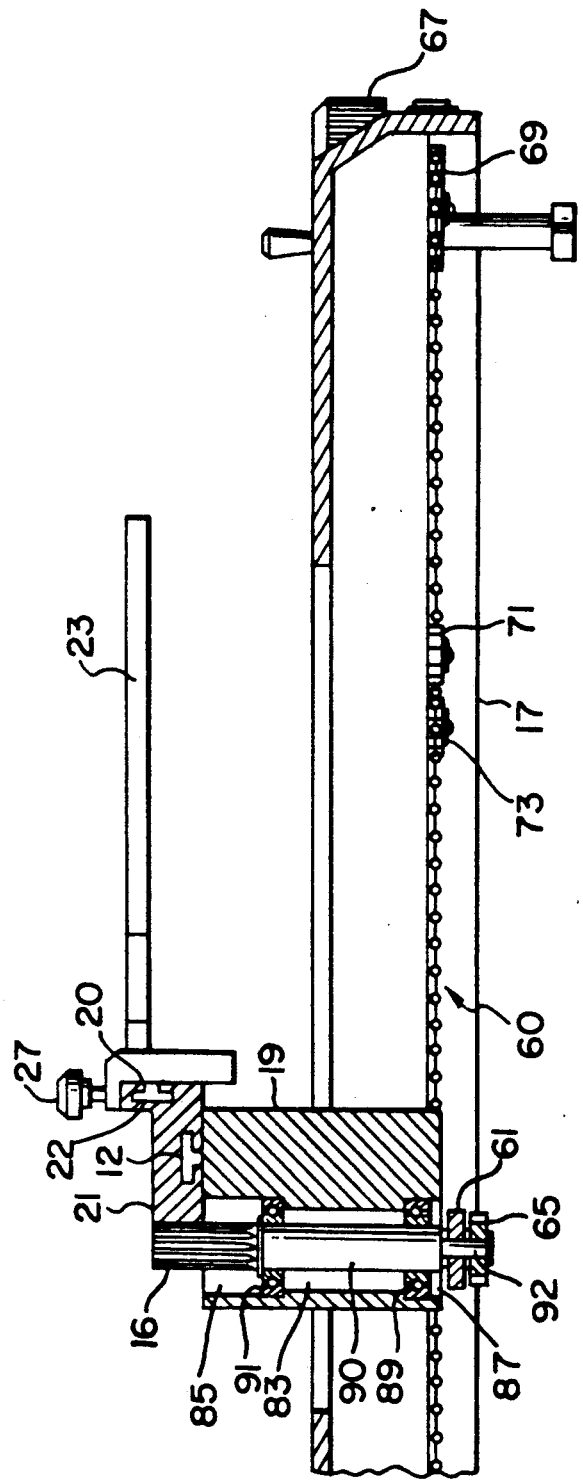
FIG. 5 is a sectional view of the preferred embodiment taken at 5—5 of FIG. 2.

The base 17 carries a pinion block 19 on which a horizontal arm 21 is slidable mounted. The horizontal arm 21 slidably mounts a right PCB carrier arm 23 and a left PCB carrier arm 25. As illustrated in FIG. 5, the slidable mounting of the horizontal arm 21 and PCB carrier arms 23, 25 is accomplished by means of respective tongue and groove interconnections 12, 20, although other means providing sliding action may be employed.

As further shown in FIG. 1, the respective PCB carriers 23, 25 each include respective jaws 26, 28 for holding a PCB, and are fastened into position by locking knobs 27, 29. The sliding jaws 26, 28 permit mounting of various sized PCBs between the PCB carriers 23, 25.

The pinion block 19 and apparatus mounted thereon are movable in the XY plane in response to turning of an X axis control knob or dial 51 and a Y axis control knob or dial 67. These control knobs 51, 67 are cylindrical in shape and are mounted in the beveled front edge 16 of the base 17, such that the cylindrical wall of each knob 51, 67 extends slightly beyond the front edge 16, as shown, for example, in FIGS. 2 and 3. The front of the base 17 is also preferably supplied with controls such as an upper heater and airflow control and a vacuum control. A lower heater and airflow control may also be provided if the apparatus is equipped with a lower heater.

The gantry 15 mounts a gas delivery head 31. The gas delivery head 31 includes a heat focus head 35 for focusing hot air on an integrated circuit, a vacuum pickup 37, a vacuum pickup plunger 39, and a head release and "theta" control 41. The gantry 15 also mounts an upper heater vertical control knob 33 for lowering and raising the heat focus head 35 with respect to a PCB held in the PCB carriers 23, 25.

In overall operation, the vacuum pickup 37 is used to apply a slight vacuum to an integrated circuit located on a PCB. The vacuum lifts the integrated circuit after the solder has been loosened by hot air applied by the heat focus head 35, as known in the prior art. The vacuum pickup plunger 39 is used to lower the vacuum pickup 37 against a spring bias in order to contact the integrated circuit, after which the vacuum is applied. The pickup plunger 39 may also provide theta control. The head release 41 similarly provides theta positioning of the heat focus head 35 and may be used to assist in removing epoxied circuits.

Figure 2:
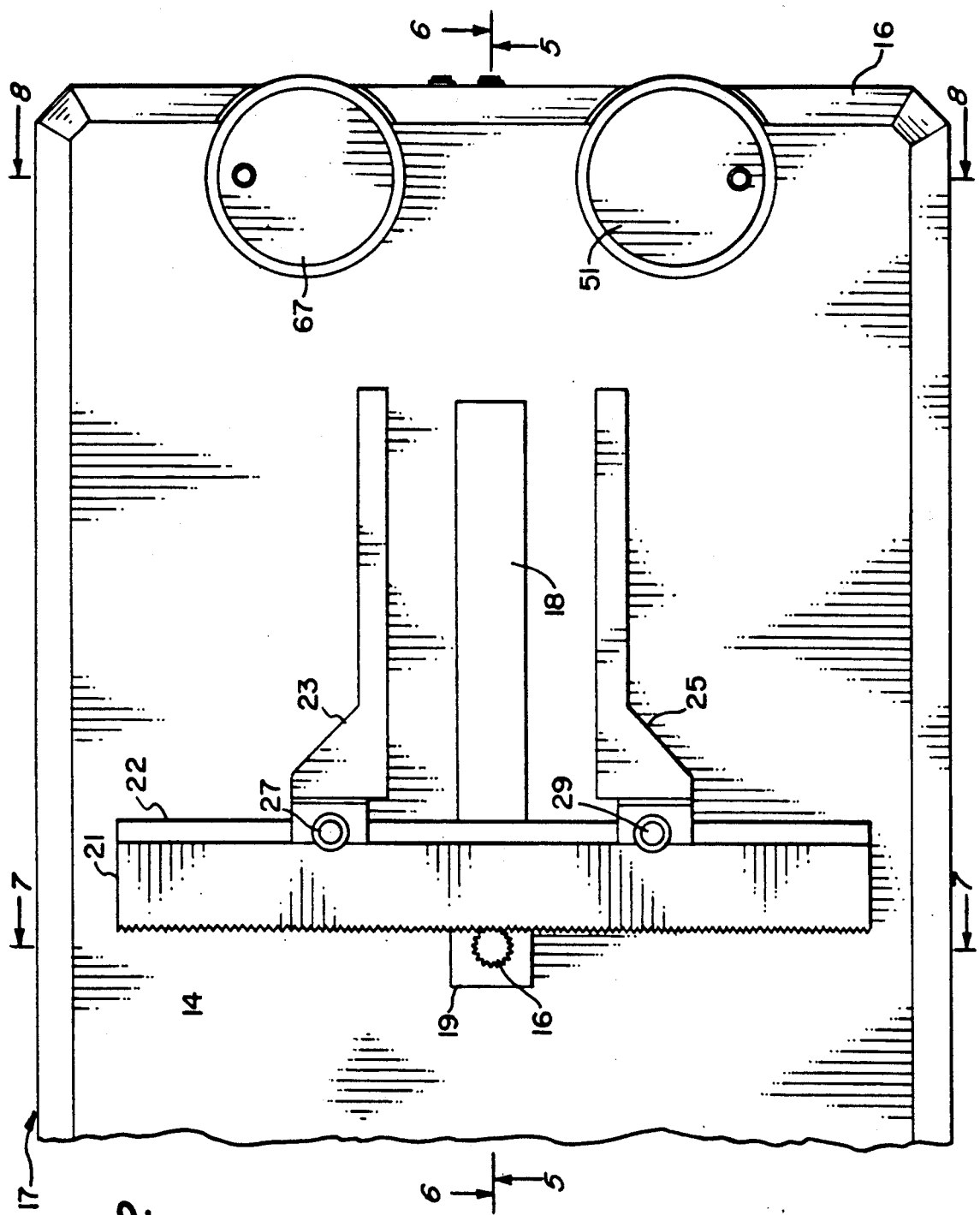
FIG. 2 is a partial top view of the preferred embodiment taken at 2—2 of FIG. 1.
Figure 3:
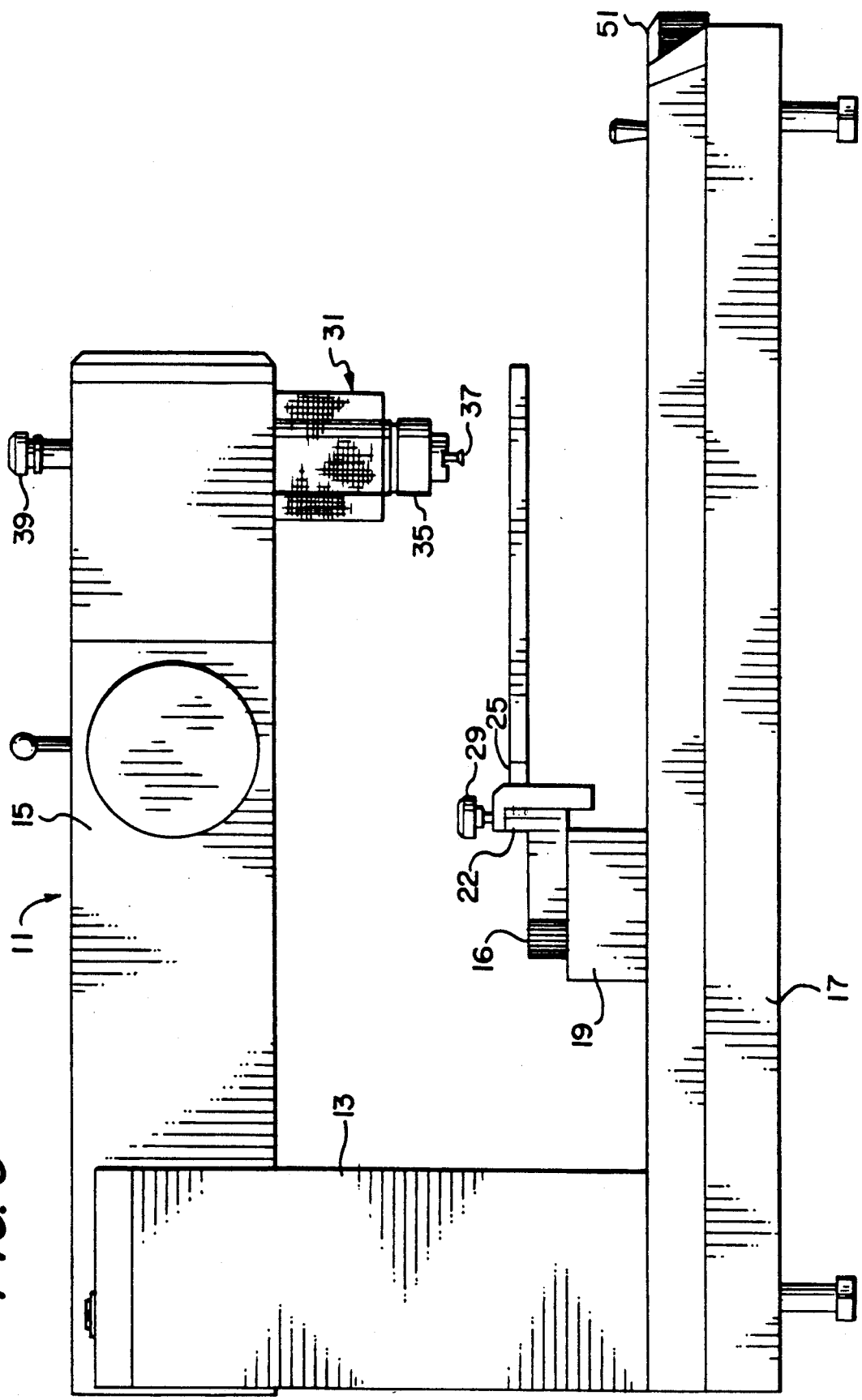
FIG. 3 is a side view of the preferred embodiment.

As shown in FIG. 2, the pinion block 19 carries a pinion gear 16 which meshes with teeth 14 formed along the entire rear side of the horizontal arm 21. Rotation of the pinion gear 16 positions the arm 21 and associated PCB carriers 23, 25 with respect to the block 19 in the X direction in the horizontal plane.

Figure 6:
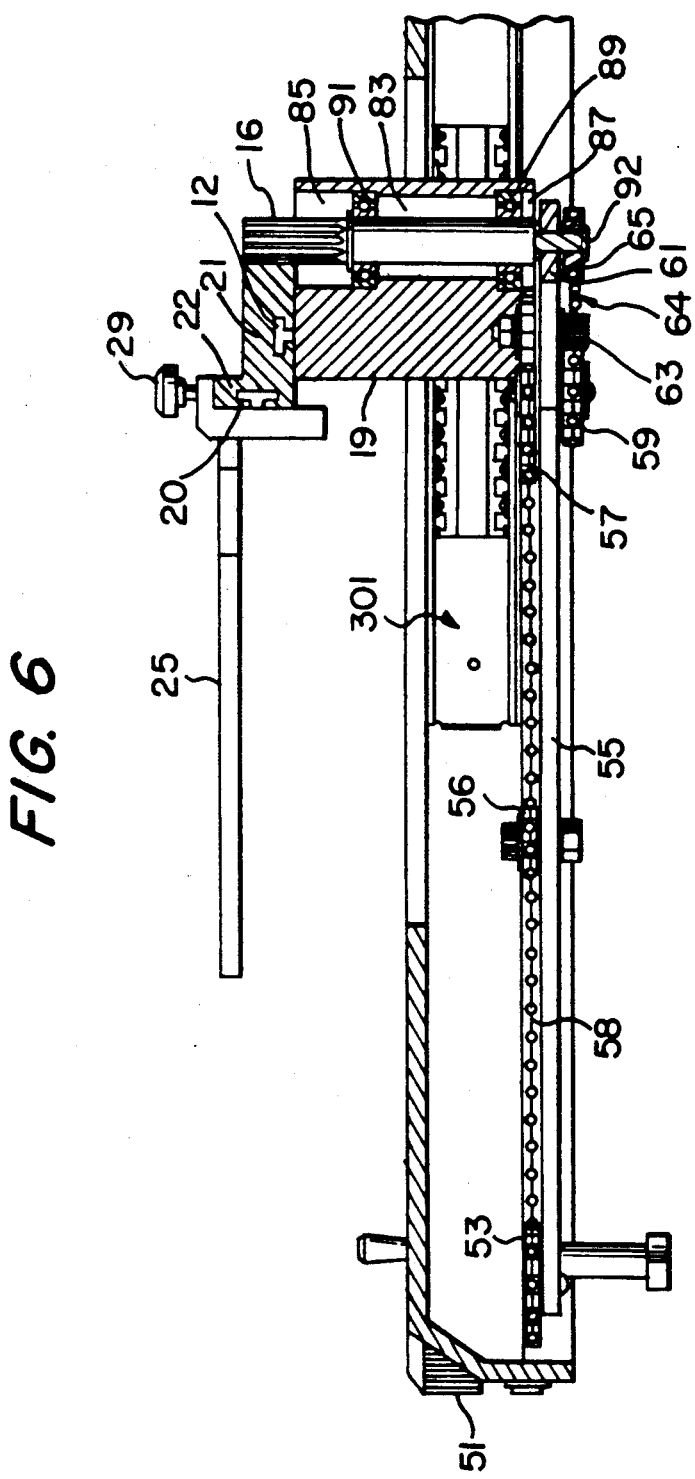
FIG. 6 is a sectional view of the preferred embodiment taken at 6—6 of FIG. 2.
Figure 7:
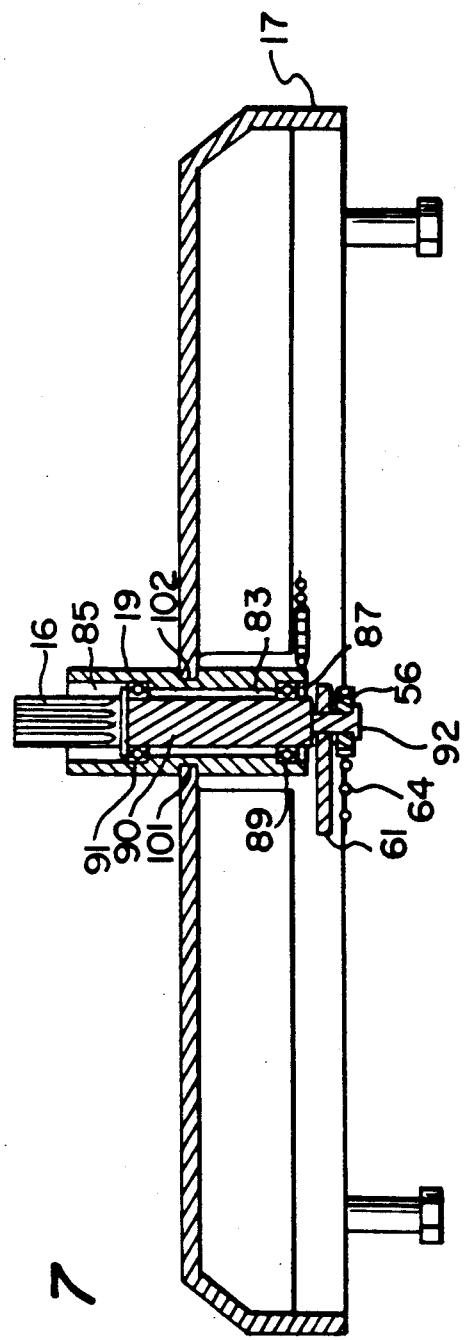
FIG. 7 is a sectional view of the preferred embodiment taken at 7—7 of FIG. 2.

As additionally shown in FIG. 2, the base 17 includes a guide way 18 in which the block 19 moves in the Y direction, thereby moving the PCB carriers 23, 25 in the Y direction in the horizontal plane. As shown in FIG. 6, pinion block 19 is slidably mounted by a conventional slide rail mechanism 301 to ride in the Y direction with respect to the base 17.

Figure 4:
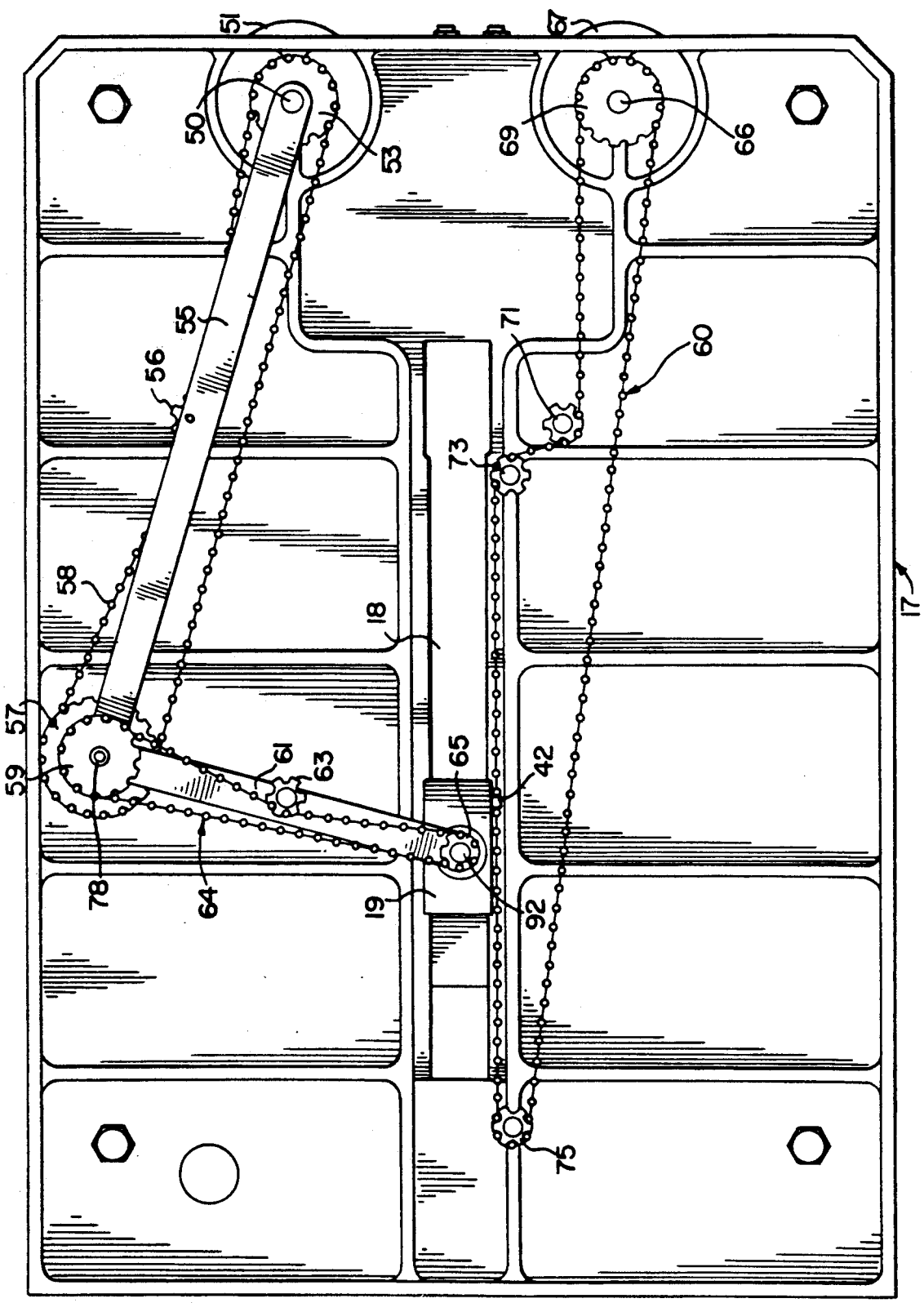
FIG. 4 is a bottom view of the preferred embodiment.

FIGS. 4 through 8 particularly illustrate the drive apparatus responsive to rotation of the knobs 51, 67 to rotate the pinion gear 16 to provide the X axis positioning and to move the pinion block 19 in the guide way 18 to provide the Y axis positioning. As illustrated in FIG. 4, the Y axis control knob 67 is connected through a drive shaft 66 to rotate a drive sprocket 69. The Y axis drive further includes rotatably mounted idlers 71, 73, 75 and a bead string 60. The bead string 60 is interlinked with the gear teeth of the drive sprocket 69 and the idlers 71, 73, 75 such that the bead string 60 rides around the sprocket 69 and idlers 71, 73, 75 upon rotation of the sprocket 69 in either a clockwise or counterclockwise manner. The bead string 60 is fixed to the pinion block 19 by a clamp 42 to transmit the Y drive to the pinion block 19.

With respect to the X axis control structure, the X axis control knob 51 is connected to drive a drive sprocket 53 via a shaft 50. Also pivotally mounted to the shaft 50 is a long swivel arm 55, which carries a rotatably mounted idler 56. At the end of the long swivel arm 55 opposite the shaft 50 are mounted a large diameter sprocket 57, a smaller diameter sprocket 59, and a short swivel arm 61. These elements 57, 59, 61, as well as the long swivel arm 55, are pivotally mounted on a shaft 78. The short swivel arm 61 is pivotally mounted to a drive shaft 92, which rotates in the pinion block 19. A sprocket 65 is fixed to the shaft 92.

First and second bead strings 58, 64 are employed in providing the X axis motion. The first bead string 58 is operatively interfitted with the sprockets 53, 57 and idler 56. The shorter bead string 64 is operatively interfitted with the sprockets 59, 65 and idler 63. The beads themselves fit into notches in the sprockets and, thus, cooperate in receiving or transmitting driving force.

X and Y motion is imparted by the just-discussed structure as follows. Y axis motion of the pinion block 19 is imparted by rotation of the Y axis control knob or dial 67, which results in linear motion of the bead string 60 in the Y direction between the two idlers 73, 75, thus moving the pinion block 19 within the guide way 18, either to the right or left in FIG. 4, depending on whether the control knob 67 is rotated clockwise or counterclockwise.

X axis motion is provided by rotation of the X axis control knob 51, which results in rotation of the sprocket 57, which is imparted to the sprocket 59 and, in turn, to the sprocket 65. The shaft 78 thus provides a floating interconnection point for the swivel arms 55, 61 and an articulated floating drive capable of imparting X axis motion while following the Y axis motion of the pinion block 19 and while retaining the drive apparatus within the confines of the outer contour of the base 17.

Figure 8:
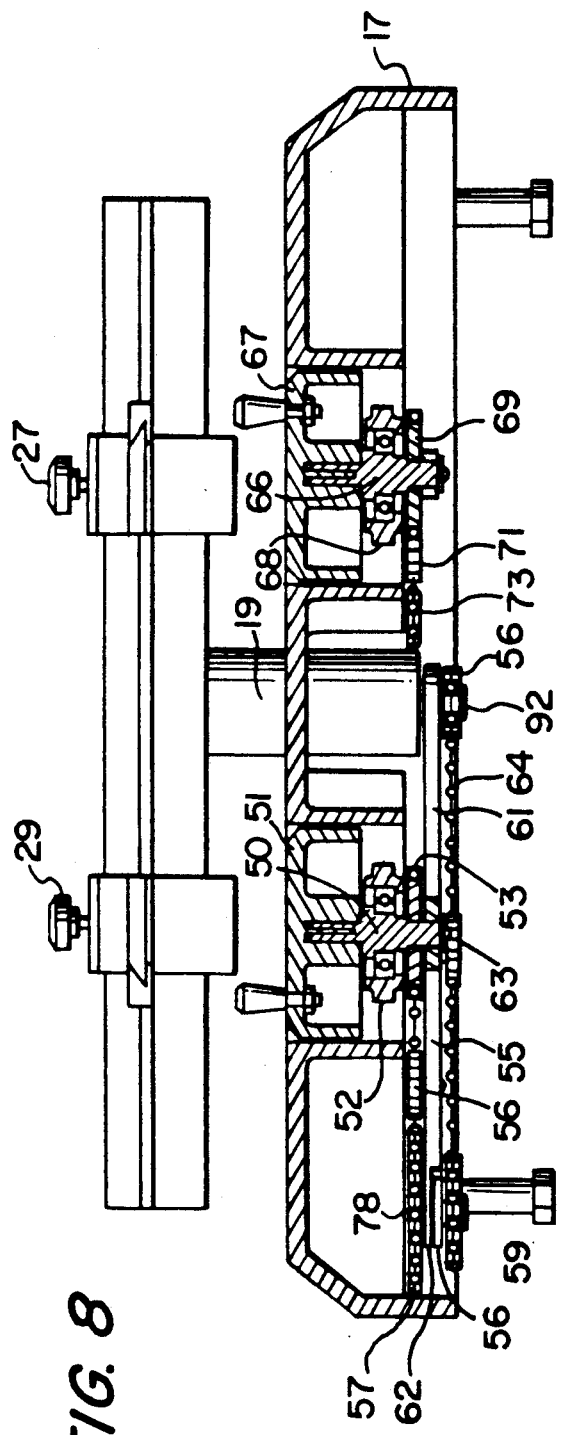
FIG. 8 is a sectional view of the preferred embodiment taken at 8—8 of FIG. 2.

As particularly shown in FIG. 8, the long arm 55 and short arm 61 have end portions 56, 62 which are complementarily narrowed in width such that both arms may be pivotally mounted on the shaft 78 without interfering with one another and such that the two arms 56, 61 lie substantially in the same plane. FIG. 8 further illustrates bearings 52, 68 which rotatably mount the controls 51, 67 to shafts 50, 66.

As may be further appreciated from FIG. 5, the sprocket 65 is fixed to the cylindrical drive shaft 92, which is integrally formed with a larger cylindrical shaft 90, to which the pinion gear 16 is attached. The shaft 90 is mounted in a cavity within the pinion block 19 by bearings 89, 91. The cavity in the pinion block 19 comprises upper and lower bores 85, 87, and a central bore 83. The upper and lower bores 85, 87 are of the same diameter. This diameter is larger than that of the central bore 83, resulting in the formation of edges which assist in mounting the bearings 89, 91.

Figure 9:
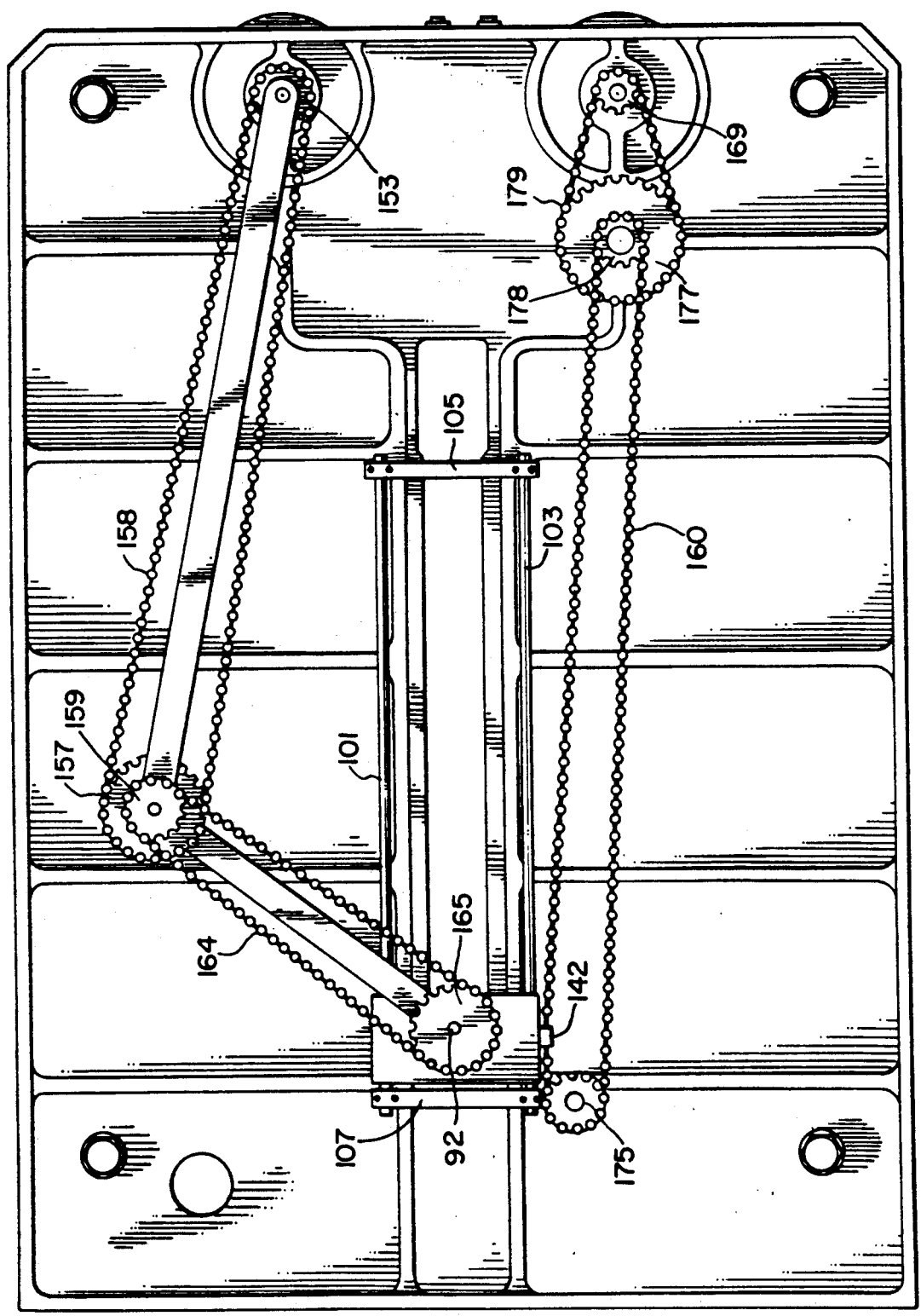
FIGS. 9 and 10 illustrate alternate preferred embodiments.

FIG. 9 illustrates an alternative and presently preferred drive mechanism for providing X and Y drives to the PCB carrying apparatus. The embodiment of FIG. 9 employs bead strings 158, 164, 160, 179 to drive respective sprockets 153, 157, 159, 165, 169, 175, 177, 178 to impart an X drive via a shaft 92 and a Y drive to a pinion block 19 via an interconnection clamp 142. The sprockets 153, 157, 159, 165, 169, 175, 177, 178 are of diameters selected to provide the resolution desired to the X and Y drives, according to principles well-known to those skilled in the art. In particular, the use of larger diameter gear 177 and smaller diameter gear 178 provides increased resolution and accuracy in the Y positioning over the embodiment of FIG. 4.

Additionally, in FIG. 9, the pinion block 19 contains conventional cylindrical linear bearings, which adapt the pinion block 19 to slide in the Y direction on respective metal rods 101, 103. The rods 101, 103 are attached to the base 17 at either end by suitable brackets 105, 107. This mounting is presently preferred over the slide rail mechanism 301 of FIG. 6.

Figure 10:
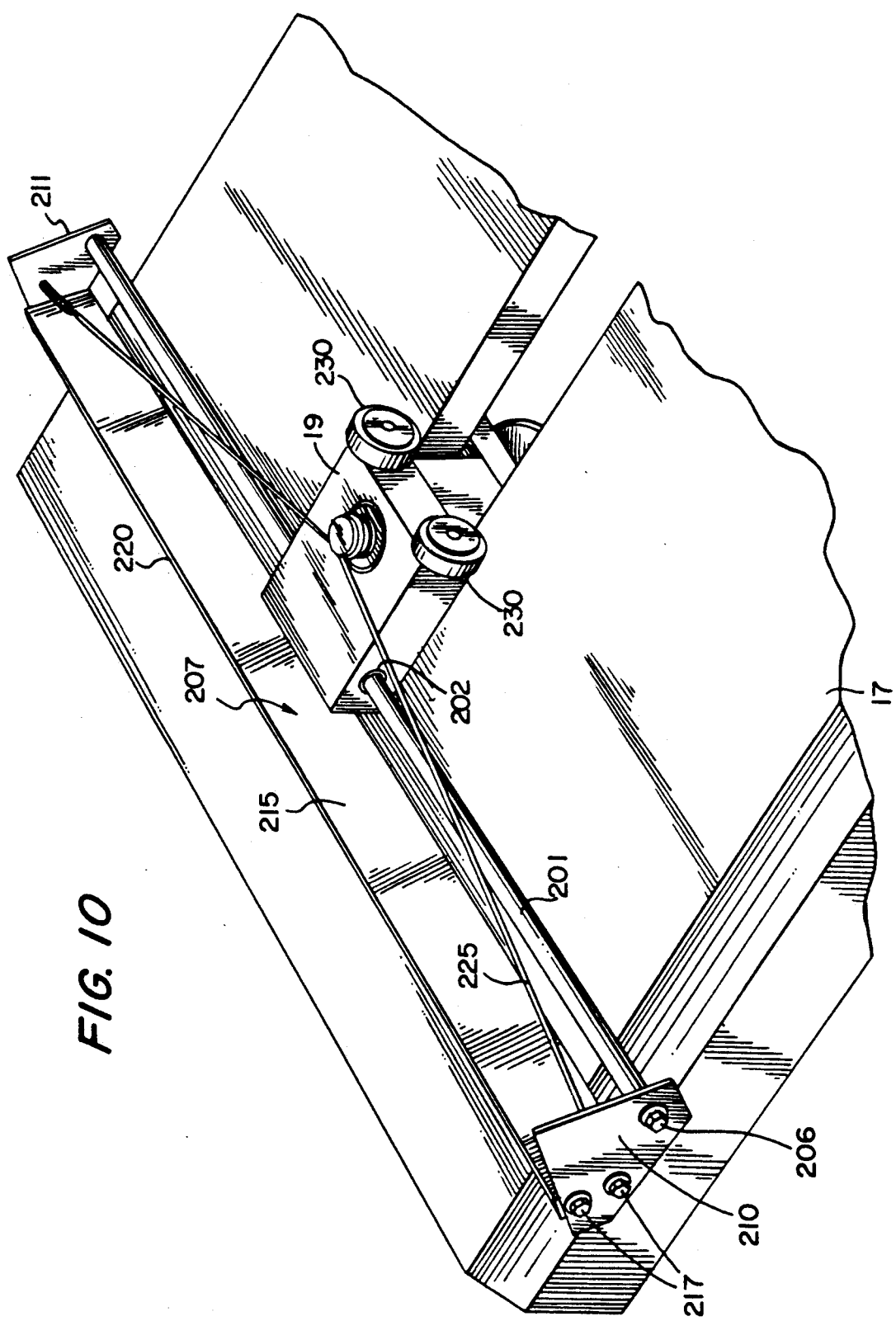

FIG. 10 illustrates an alternate and presently preferred structure for moving the PCB carriers 23, 25 (FIG. 2) in the X direction. This structure employs a cylindrical shaft 201, which is slidable through a bearing 202 in the pinion block 19. A carriage 207 has respective side plates 210, 211 pivotally mounted to either end of the shaft 201 by bolts 206. A rectangular plate 215 is bolted to each of the side plates 210, 211 by bolts 217. The rectangular plate 215 mounts PCB carriers 23, 25, which are slidably adjustable in the X direction along its linear edge 220.

Each side plate 210, 211 of the carriage 207 is attached to a continuous cable 225, which wraps around a takeup reel 203 rotatably mounted in the pinion block 19. The takeup reel is rotated by the X drive mechanism, e.g., by rotation of the sprocket 153 of FIG. 9. Rotation of the takeup reel 203, either clockwise or counterclockwise, winds up the cable 225 and drives the shaft 201 along the X direction, either to the right or left in FIG. 10. During the course of this operation, the cable 225 is shortened on one side of the pinion block 19 by being wound upon the reel 203, while the cable 225 is lengthened on the opposite side of the pinion block 19 by unwinding from the reel 203.

FIG. 10 shows the carriage 207 in a retracted position, i.e., flipped back to expose the shaft 201 and takeup reel 203. In its operational position, the carriage 207 is flipped down such that the rectangular plate 215 rests on and may slidably traverse over rotatably mounted metal bearing wheels 230. In this position the rectangular plate 215 is parallel to the top surface of the base 17 and, hence, functions in a like fashion to the horizontal arm 21 of FIG. 2, which mounts the PCB carriers 23, 25.

Thus, hot gas rework apparatus has been disclosed which features XY positioning of a PCB beneath a gas discharge head through simple manipulation of conveniently positioned front edge dials. The drive transmission is simple and economical, and operates within the confines of the base, providing for a compact, streamlined apparatus.

Those skilled in the art will appreciate that various adaptations and modifications of the just-described preferred embodiment can be configured without departing from the scope and spirit of the invention. For example, various arrangements of pulleys and idler gears may be provided to transmit X and Y drives. Although a bead string drive is preferred, substitutes for the bead string can be made, such as smooth cord, spur belts, or similar belt or linked drives, which may cooperate with suitable pulleys or gears, if desired. Therefore, it is to be understood that, within the scope of the appended claims, the invention may be practiced other than as specifically described herein.

What is claimed is:

1. A printed circuit board rework station comprising:
   a base;
   holder means for holding a printed circuit board, the circuit board having one or more components mounted thereon;
   means for applying hot gas to said component for purposes of melting solder used to attach a said component to said board;
   means for raising and lowering said hot gas applying means in the vertical direction with respect to said component;
   positioning means for positioning said holder means above said base and for slidably mounting said holder means for movement above said base in the X direction of an XYZ coordinate system;
   means for mounting said positioning means for movement with respect to said base in the Y direction of said XYZ coordinate system;
   first moving means cooperating with said positioning means for moving said holder means in said X direction;
   second moving means cooperating with said positioning means for moving said positioning means in said Y direction;
   first control means responsive to manual activation for controlling said first moving means to cause movement of said holder means in said X direction;
   said control means responsive to manual activation for controlling said second moving means for moving said positioning means in said Y direction; and
   wherein said holder means includes:
   an elongated horizontal arm means; and
   first and second holder arms slidably positioned on said horizontal arm.

2. The rework station of claim 1 wherein said first moving means comprises:
   a toothed edge on said horizontal arm;
   a shaft means mounted in said positioning means and extending therethrough; and
   a gear mounted on said positioning means for drivably engaging said toothed edge.

3. The rework station of claim 1 wherein said first moving means comprises:
   a shaft slidably mounted in said positioning means for movement in the X direction;
   carriage means for mounting said horizontal arm means having first and second ends and mounted on said shaft; and
   takeup reel means including a cable attached at each end of said carriage means for moving said shaft and carriage means with respect to said positioning means.

4. The rework station of claim 3 wherein said second moving means comprises:
   a first bead string formed in a continuous loop;
   means for mounting and guiding said first bead string within said base such that at least a portion of said first bead string lies adjacent said positioning means;
   first sprocket means engaging said first bead string for driving said first bead string about said mounting and guiding means; and
   means fixedly connecting said portion of said first bead string with said positioning means.

5. The rework station of claim 4 wherein said first moving means further comprises:
   second and third bead strings, each formed in a continuous loop; and
   means for mounting said second and third bead strings within said base and for rotating said shaft means at the same time said first sprocket means is driving said first bead string.

6. The rework station of claim 5 wherein said means for mounting said second and third bead strings comprises:
   second, third, fourth, and fifth sprocket means, the second sprocket means for supplying a drive to the second bead string, the fourth sprocket means for transmitting a drive from said third bead string to said shaft, the third and fourth sprocket means cooperating to transfer a drive from said second bead string to said third bead string; and
   first and second swivel arms pivotally mounted with respect to said base for mounting said third and fourth sprocket means.

7. The rework station of claim 6 wherein said first and second control means each comprise:
   a dial mounted at the front edge of said base.

8. The rework station of claim 1 wherein said means for mounting said positioning means comprises:
   a slot in said base; and
   slide rail means for mounting said positioning means to move in said slot.

9. The rework station of claim 1 wherein said means for mounting said positioning means comprises:
   a slot in said base;
   first and second rods mounted parallel to said slot on opposite sides thereof; and
   bearing means for mounting said positioning means to slide on said first and second rods.

10. The rework station of claim 3 wherein said means for mounting said positioning means comprises:
- a slot in said base;
- first and second rods mounted parallel to said slot on opposite sides thereof; and
- bearing means for mounting said positioning means to slide on said first and second rods.

11. Solder rework apparatus comprising:
- a substantially rectangular base having a substantially hollow interior portion and having an elongated slot therein, said slot being oriented in the Y direction;
- a drive block slidably mounted in said slot;
- a shaft rotatably mounted in said drive block, said shaft extending both above said drive block and below said drive block into said interior portion;
- a horizontal arm means slidably mounted in said drive block, above said base, for movement in the Y direction;
- means for transmitting a drive from said shaft to said horizontal arm means;
- a X control dial rotatably mounted at the front edge of said base;
- a Y control dial rotatably mounted at the front edge of said base adjacent and spaced apart from said X control dial; and
- drive means within said base for simultaneously converting rotating X and Y drives from said X control dial and Y control dial to a rotating X drive applied to said shaft and to a linear Y drive applied to said drive block, respectively.

12. The apparatus of claim 10 wherein said X and Y control dials are mounted on parallel axes spaced equidistant from the edge of said base, said dials each extending slightly beyond said edge.

13. The apparatus of claim 11 wherein said dials each have an upright finger grip member affixed thereto.

14. Circuit positioning apparatus comprising:
- a circuit carrying means;
- a support means;
- a shaft slidably mounted in said support means for movement in a first direction;
- carriage means for mounting said circuit carrying means having first and second ends and mounted on said shaft; and
- means for moving said shaft and carriage means with respect to said support means.

15. The positioning apparatus of claim 14 further including:
- wheel means mounted for rotation on said support means for supporting said carriage means.

16. The positioning apparatus of claim 14 wherein said means for moving includes a takeup reel means including a cable attached at each end of said carriage means.

* * * * *